United States Patent [19]
Marquot

[11] Patent Number: 5,886,926
[45] Date of Patent: Mar. 23, 1999

[54] CIRCUIT AND METHOD OF MEASURING THE NEGATIVE THRESHOLD VOLTAGE OF A NON-VOLATILE MEMORY CELL

[75] Inventor: Alexis Marquot, Arenthon, France

[73] Assignee: Motorola Inc., Austin, Tex.

[21] Appl. No.: 10,042

[22] Filed: Jan. 20, 1998

[30]     Foreign Application Priority Data

Jan. 30, 1997 [GB] United Kingdom .................... 9701927

[51] Int. Cl.⁶ .................................................. G11C 16/06
[52] U.S. Cl. ............................... 365/185.21; 365/185.18; 365/185.22; 365/185.24
[58] Field of Search ......................... 365/185.21, 185.18, 365/185.22, 185.24

[56]              References Cited

U.S. PATENT DOCUMENTS

| | | | |
|---|---|---|---|
| 5,117,392 | 5/1992 | Harada | 365/185.21 |
| 5,579,274 | 11/1996 | Van Buskirk et al. | 365/185.21 |
| 5,600,594 | 2/1997 | Padoan et al. | 365/185.21 |
| 5,748,534 | 5/1998 | Dunlap et al. | 365/185.21 |
| 5,790,459 | 8/1998 | Roohparver | 365/185.21 |

FOREIGN PATENT DOCUMENTS 2049202  2/1980  United Kingdom .

*Primary Examiner*—Son T. Dinh

[57]                ABSTRACT

A portable data carrier (10) embodies an integrated circuit (12) with an EEPROM (24). The EEPROM has a number of rows of memory cells (32, 38) each having outputs respectively coupled to bit lines (50, 54). The EEPROM cells have a common array ground node (56). A pull-up transistor (74) is coupled to the common array ground node for developing a first positive voltage on the common array ground node which in turn develops a second positive voltage on the output of one of the memory cells corresponding to a negative threshold voltage of the memory cells. A sensing circuit (88) is coupled to one of the bit lines for detecting the level of the second positive voltage and thus determining the negative threshold voltage of the memory cell.

11 Claims, 3 Drawing Sheets

CIRCUIT AND METHOD OF MEASURING THE NEGATIVE THRESHOLD VOLTAGE OF A NON-VOLATILE MEMORY CELL

BACKGROUND OF THE INVENTION

The present invention relates in general to non-volatile memory circuits and, more particularly, to measuring the negative threshold voltage of a non-volatile memory cell.

Electrically erasable programmable read only memories (EEPROMs) are found in many applications where it is necessary to use a non-volatile memory. One such application is in the field of portable data carriers (PDC), otherwise known as smart cards. A PDC is generally made of plastic, about the size of a conventional credit card, and includes one or more semiconductor die embedded in the PDC. The semiconductor die(s) include a microprocessor, memory, and various input and output (I/O) circuitry. While a conventional credit card with a magnetic strip typically stores a few hundred bits of data, the PDC with its expanded memory can store 8K or more 8-bit bytes of data.

The additional storage capacity of the PDC vastly expands its useful applications. For example, the PDC can be used to store the user's medical history. The user presents the PDC to a health care provider who, through a PDC reader, extracts the patient's medical history, including personal data, primary care physician, health insurance, allergies, medication, past procedures, blood type, religious preference, organ donor, etc. Other applications for PDCs include banking services, identification for nationality and passport, and transportation transactions such as ticket and fare collection. For example, the PDC can be programmed to hold a monetary value. When making a purchase, the user inserts the PDC into the PDC reader and the purchase amount is automatically deducted from the stored monetary value. PDCs are applicable virtually anywhere the user needs to convey or exchange data or information.

The PDC is available to operate in contact and contactless modes. In contact mode, the PDC is inserted into the PDC reader. The PDC reader comes in direct electrical contact with terminal pads on the PDC to supply operating power and to read and write data. In contactless mode, the PDC uses radio frequency (RF) transmission circuitry. The contactless PDC is placed in the vicinity of the PDC reader and the information exchange occurs over the RF link.

The PDC generally does not contain a local power source such as a battery. The PDC receives operating power at the beginning of each transaction by the direct electrical contact, or via the RF link. The memory area on the PDC is divided between random access memory (RAM), read only memory (ROM), and EEPROM. The RAM is volatile memory and maintains temporary data used only during the time that power is supplied by the PDC reader. The ROM and EEPROM are non-volatile memory and, although can only be accessed during the time that power is supplied by the PDC reader, maintain their contents even during times of zero operating power.

The EEPROM array is arranged in a matrix of memory cells. Each memory cell has a floating gate transistor that stores a logic one or a logic zero. A logic one is stored as a positive charge on the floating gate, and a logic zero is stored as a negative charge on the floating gate. A floating gate transistor with a negatively charged floating gate has a positive threshold voltage (VT) related to the stored charge. A floating gate transistor with a positively charged floating gate has a negative threshold voltage related to the stored charge. A fully charged floating gate yields a VT of about ±5 volts.

Once the EEPROM cell is written, the stored charge decays over time because of leakage. The stored charge typically has a life expectancy of about 10 years before the VT drops below a minimum value of about ±2 volts and the cell contents become unpredictable.

One way of determining the life expectancy of an EEPROM cell is to measure its VT during the manufacturing process. If the measured VT is greater than a specified value, e.g. 5 volts, then the stored charge is expected to last the projected lifetime. If the measured VT is less than the specified value, then the stored charge is unlikely to last the projected lifetime. If the VT begins at a level lower than the specified value, then as the stored charge decays over time, the VT will become less than the minimum acceptable value before the end of its projected life expectancy. When EEPROM cells with unacceptably low VTs are detected, the manufacturing process is evaluated for problems.

There are known techniques to measure a positive VT. For example, a variable positive voltage can be applied to the floating gate and increased until the transistor turns on. The point that the floating gate transistor turns on is the positive VT. However, the negative VT of the floating gate transistor cannot be measured in the same manner.

Hence, a need exists to measure the negative VT of a non-volatile memory cell.

DETAILED DESCRIPTION OF THE PREFERRED EMBODIMENT

Figure 1:
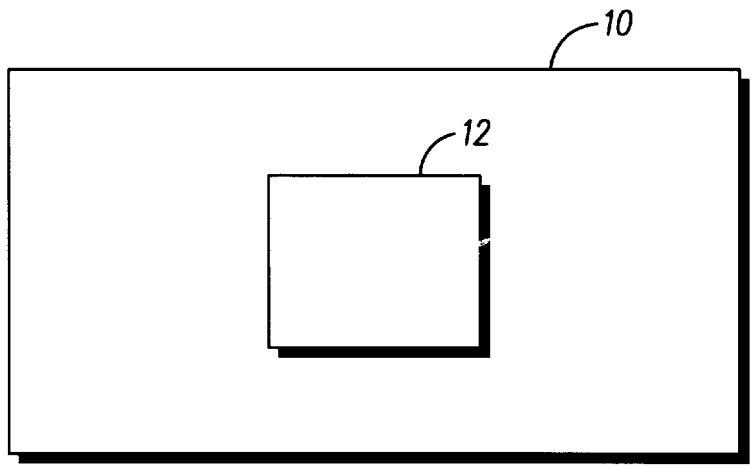
FIG. 1 illustrates a PDC with an embedded integrated circuit.

Referring to FIG. 1, a PDC 10, also known as a smart card or chip card, is shown with embedded integrated circuit (IC) 12. IC 12 includes memory, I/O circuitry, and optionally a microprocessor or other controller, to allow PDC 10 to convey or exchange potentially large amounts of information with a PDC reader (not shown). PDC 10 is used in many applications such as banking, transportation, medical, identification, and security. For example, PDC 10 may contain the user's personal data, medical history, national identification, and/or passport. PDC 10 can store financial information such as bank account information, stock portfolio, and other investments. PDC 10 can store monetary value(s) which is automatically deducted from, including any applicable foreign exchange rates, each time the user conducts a transaction such as to pay transportation fares, purchase merchandise, or access long-distance telephone services. PDC 10 can store security codes for access to restricted areas.

PDC 10 operates in contact mode and contactless mode. In contact mode, PDC 10 is inserted into, or swiped through, a PDC reader that makes direct electrical contact with terminal pads on the PDC. The PDC reader provides operating power to PDC 10 and performs the necessary read and write operations to complete the transaction. For example, PDC 10 is inserted into a PDC reader of a vending machine and the purchase amount for the selected item is deducted.

In contactless mode, PDC 10 is brought into the vicinity of the PDC reader which transmits an RF signal to the PDC. PDC 10 includes one or more RF coils wound around the perimeter of the carrier that extract operating power from the RF signal to energize IC 12. The information between the PDC reader and PDC 10 is also exchanged over the RF link. For example, PDC 10 is held within a few centimeters of the PDC reader that controls a door lock. The PDC reader transmits an RF signal to supply operating power to PDC 10 which then transmits the user's identification and security access codes to the PDC reader. The user may also need to key in a personal identification number into a keypad on the PDC reader to gain access to the restricted area.

Figure 2:
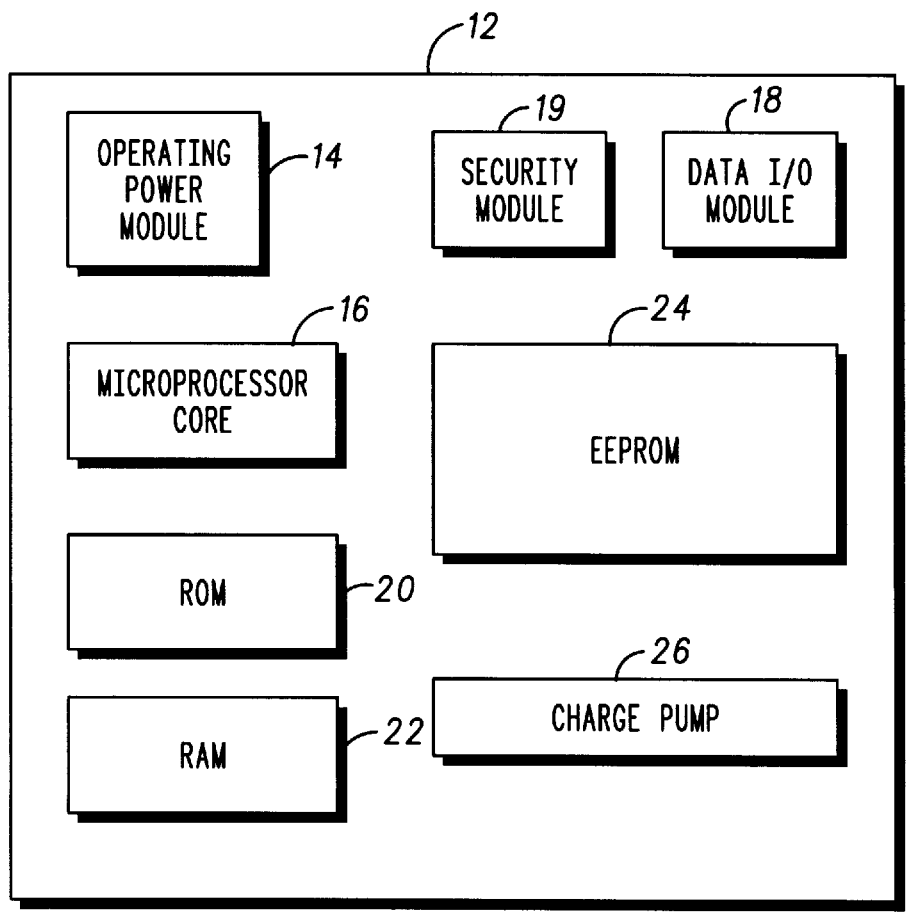
FIG. 2 is a block diagram illustrating the layout of the integrated circuit.

In FIG. 2, the layout of IC 12 is shown in further detail. Circuit 12 includes one or more semiconductor die for the circuitry shown. Operating power module 14 receives operating power either by direct contact with the PDC reader, or from an external RF coil embedded in PDC 10. Operating power module 14 distributes a positive power supply potential VDD, for example VDD=3 to 5 volts DC ±10%, to the other circuitry in IC 12. Microprocessor core 16 performs the control, timing, and decision making functions of PDC 10. For example, microprocessor 16 controls the read, write and erase operations to the memory and makes data available to data I/O module 18. Data I/O module 18 sends and receives data from the PDC reader. In contact mode, data I/O module 18 makes direct electrical contact with terminals on the PDC reader to exchange information. In contactless mode, data I/O module 18 interacts with the PDC reader over an RF link. An external RF data coil, possibly the same coil used for receiving operating power, is embedded in PDC 10. Data I/O module 18 receives data from the PDC reader over the RF link and demodulates the data for use by other modules in IC 12. Data I/O module 18 also modulates data from the memory modules for transmission over the RF link to the PDC reader. Security module 19 prevents unauthorized use or access of PDC 10 and routinely checks operating integrity.

ROM module 20 stores the program instructions for the given application which are set during the manufacturing process and then executed by microprocessor 16. ROM module 20 provides flexibility in programming the PDC for a variety of applications. ROM module 20 is non-volatile and ranges in size from 6K to 20K bytes of data. RAM module 22 is volatile memory and provides temporary storage of 256 to 512 bytes. EEPROM 24 is non-volatile memory array that stores the primary information of PDC 10 such as personal identification, medical history, banking information, monetary values, security codes, etc. depending on the application. The storage capacity of EEPROM 24 ranges from 8K to 64K 8-bit bytes of data, although greater capacities are within the scope of the present invention. Other types of non-volatile memory can be used in place of EEPROM 24.

IC 12 further includes charge pump 26 that receives VDD and provides a pumped voltage VPSW (voltage supply switch) having a value of either VDD=3 volts ±10% or VPP =10 to 20 volts ±10% in response to a data signal stored in a control register (not shown) by microprocessor 16.

Figure 3:
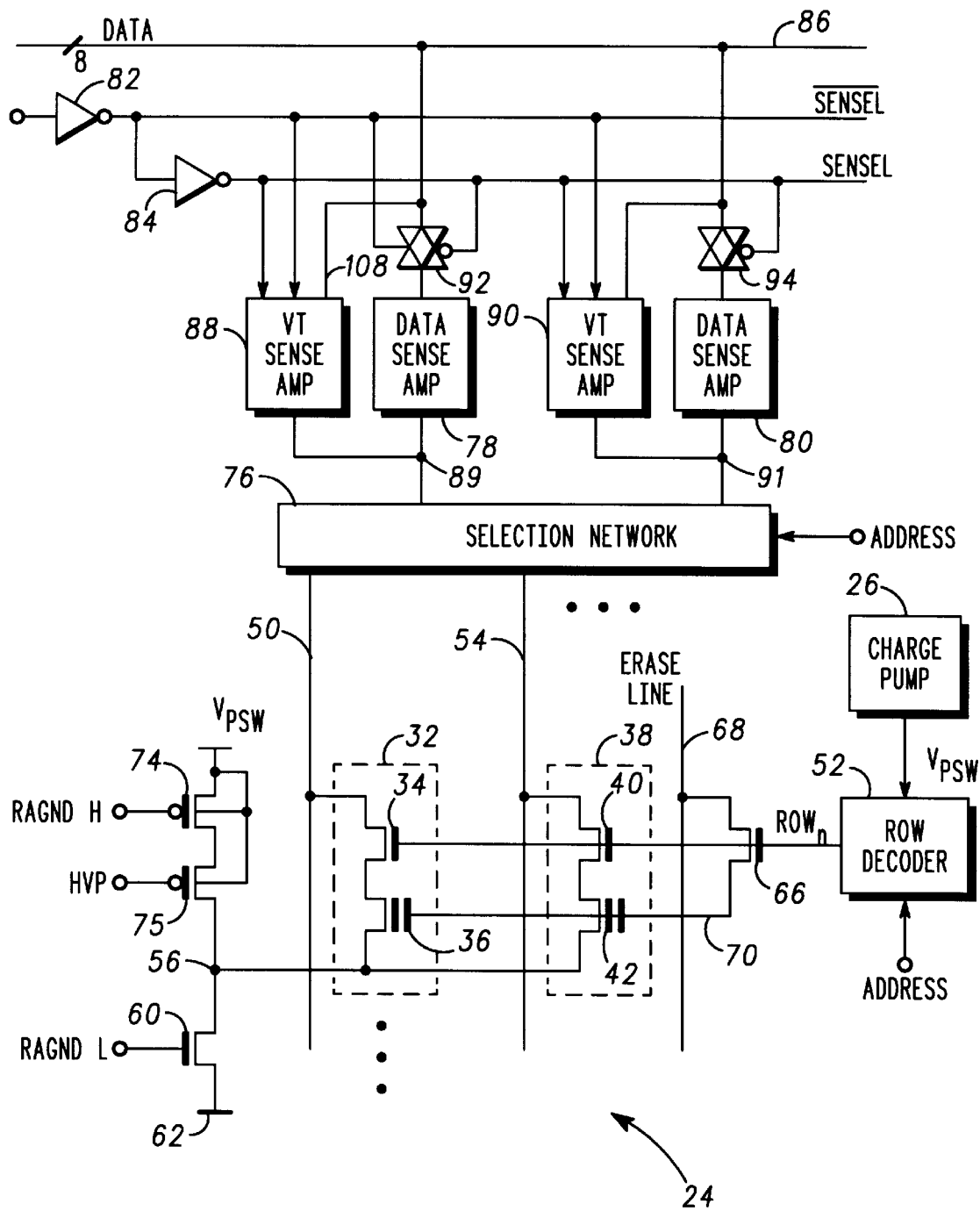
FIG. 3 is a block diagram of the EEPROM array.

EEPROM array 24 is shown in further detail in FIG. 3 as a matrix of EEPROM cells arranged in rows and columns. There are three modes of operation for EEPROM 24: erase mode, write mode, and read mode. In erase mode, the contents of the selected EEPROM cells are programmed to logic zero, i.e. the erase state. In write mode, the contents of the selected EEPROM cells are programmed to logic one, i.e. write state. In read mode, the contents of the selected EEPROM cells are read and placed on the data bus for transfer to data I/O module 18.

FIG. 3 illustrates two EEPROM cells in one row. The combination of one select transistor and one floating gate transistor comprise one EEPROM cell containing one bit of data. For example, a first EEPROM cell 32 comprises select transistor 34 and floating gate transistor 36. A second EEPROM cell 38 comprises select transistor 40 and floating gate transistor 42 in the first row. There are at least eight cells in each row representing one 8-bit byte. In one embodiment, EEPROM array 24 includes 32 8-bit bytes of data (256 cells) in each row and 256 rows for a total capacity of 8K bytes.

In a first column, the drain of select transistor 34 is coupled to bit line 50 of EEPROM 24. Bit line 50 represents bit 7 of the 8-bit data byte. In the 8K embodiment, there are 256 EEPROM cells in one column connected to bit line 50. During any operation, 1 of the 256 rows is selected by a ROWn signal, where n ranges from 0 to 255. The ROWn control signal is decoded in row decoder 52 with an 8-bit ADDRESS signal from microprocessor 16. For example, an ADDRESS of "00000000" decodes to a logic one for the selected ROWn signal and logic zeroes for the other unselected row signals. Charge pump 26 provides a dual level power supply voltage VPSW to row decoder 52 so the actual voltage levels for logic one and logic zero depend on the memory operation. In write and erase operations, a logic one ROWn signal has a voltage level VPSW of VPP=20 volts and a logic zero ROWn signal has a voltage level of VDD=3 volts. In a read operation, a logic one ROWn signal has a voltage level VPSW of VDD=3 volts and a logic zero ROWn signal has a voltage level of zero volts. The logic one ROWn signal turns on select transistors 34 and 40 to enable EEPROM cells 32 and 38. The logic zeroes in the unselected rows turn off associated select transistors and disables all other EEPROM cells coupled to the bit lines.

In a second column, the drain of select transistor 40 is coupled to bit line 54. Again, there are 256 EEPROM cells in the column connected to bit line 54. Bit line 54 represents bit 6 of the 8-bit data byte.

The sources of transistors 36 and 42 are coupled to common array ground node 56. The sources of all floating gate transistors in EEPROM array 24 are coupled to the common array ground node 56. Transistor 60 connects array ground node 56 to power supply conductor 62 operating at ground potential in response to a logic one control signal RAGNDL (reset array ground low). Transistor 60 allows array ground node 56 to float in response to a logic zero control signal RAGNDL. Transistor 66 connects erase line 68 to control line 70 when the ROWn is logic one. Transistor 74 connects a high voltage VPSW of VPP=10 volts to array ground node 56 in response to a logic zero control signal RAGNDH (reset array ground high). Transistor 75 provides high voltage protection with its gate connected to HVP (high voltage protection). The HVP signal operates a zero volts when VPSW=VDD and 10 volts when VPSW=VPP. In an alternate embodiment, the voltage VPP may be provided externally. The substrates of transistors 74 and 75 are coupled to VPSW to prevent substrate injection. RAGNDL and RAGNDH are set in the control register by microprocessor 16.

In the physical structure of transistor 36, a control gate is disposed above a floating gate, and the floating gate is disposed above the channel between the drain and source regions separated by a narrow oxide layer approximately 100 angstroms thick.

To erase the contents of EEPROM cell 32, bit line 50 is set to logic zero by a bit line latch (not shown). The ADDRESS signal sets the ROWn signal to the programming voltage VPP=20 volts to enable transistor 34 and pass the zero voltage from bit line 50 to the drain of transistor 36.

Erase line 68 is set to the programming voltage VPP with an erase line latch (not shown). The ROWn signal operating at VPP=20 volts enables transistor 66 and places the programming voltage VPP on the gate of transistor 36. The control signal RAGNDL is set to a logic one to turn on transistor 60 and place a zero voltage on the source of transistor 36.

The high electric field on the floating gate from VPP extracts negative charges from the drain and source regions of transistor 36 across the narrow oxide layer by a process commonly known as tunnel effect. The negative charges on the floating gate attract holes, i.e. positive charges, to the channel region and render transistor 36 in a non-volatile, non-conductive erase state. The charges are stored on the floating gate have a life span of approximately 10 years. In the erase state, transistor 36 has a positive threshold voltage (VT) of about 5 volts. That is, the voltage applied to the control gate must be at least 5 volts greater than the source voltage before transistor 36 conducts.

To write a value to EEPROM cell 32, the programming voltage VPP=20 volts from the bit line latch is placed on the drain of transistor 36, and a zero voltage from a pull-down transistor on erase line 68 is placed on the gate of transistor 36. The control signal RAGNDL is set to a low level to turn off transistor 60 and float the source of transistor 36. The programming voltage VPP=20 volts DC on the drain of transistor 36 imposes a high electric field across the drain-gate junction and extracts negative charges from the floating gate. The lack of negative charge creates holes or positive charges on the floating gate. The positive charges on the floating gate attract electrons, i.e. negative charges, to the channel region and render transistor 36 in a non-volatile, conductive write state. In the write state, transistor 36 has a negative VT of about −5 volts. That is, the voltage applied to the control gate must be at least 5 volts less than the source voltage in order for transistor 36 to become non-conductive.

The 256 bit lines are coupled to selection network 76. Selection network 76 comprises a plurality of pass transistors arranged in a tree network and controlled by the ADDRESS signal from microprocessor 16 to select 8 (1 byte) of the 256 bit lines. The 8 selected bit lines are connected through selection network 76 to 8 data sense amps. For example, selection network 76 responds to one ADDRESS value to connect the bit lines 50 and 54 to data sense amps 78 and 80, respectively. Selection network 76 responds to another ADDRESS value to connect the bit lines of another group of EEPROM cells in different columns to the 8 data sense amps.

During a read operation, bit line 50 conducts a current, or no current, to data sense amp 78 depending on the contents of the selected EEPROM cell in the first column. The gate and source of transistor 36 both receive zero volts, i.e. gate-source voltage (VGS) is zero. If EEPROM cell 32 is in its write state, a 50 microamp current flows between the drain and source of transistor 36 because VGS=0 is greater than VT=−5. Data sense amp 78 detects a current flow in bit line 50 and provides a logic one voltage on bit 7 of data bus 86. If EEPROM cell 32 is in its erase state, no current flows between the drain and source of transistor 36 because VGS=0 is not greater than VT=5. Data sense amp 78 sense no current flow and places a logic zero on bit 7 of data bus 86. Bit line 54 conducts a current to data sense amp 80 depending on the contents of the selected EEPROM cell in that column. Data sense amp 80 senses the current flow in bit line 54 and places a corresponding logic value on bit 6 of data bus 86. There are six additional bit lines representing bit 5 to bit 0 with corresponding EEPROM cells and sense amps similar to bit 7 and bit 6. The 8-bit data byte on data bus 86 is routed to data I/O module 18 for transfer to the PDC reader.

EEPROM 24 includes VT sense amp 88 having an input coupled to the input of data sense amp 78 at node 89. VT sense amp 90 has an input coupled to the input of data sense amp 80 at node 91. Control signals SENSEL (sense select) and $\overline{\text{SENSEL}}$ are set in the control register by microprocessor 16. SENSEL and $\overline{\text{SENSEL}}$ select either the VT sense amp or the data sense amp as active. Transmission gate 92 is coupled between the output of data sense amp 78 and data bus 86. Transmission gate 94 is coupled between the output of data sense amp 80 and data bus 86. Transmission gates 92 and 94 can be implemented with back-to-back n-channel and p-channel transistors. The gate of the p-channel transistor receives SENSEL and the gate of the n-channel transistor receives $\overline{\text{SENSEL}}$.

Figure 4:
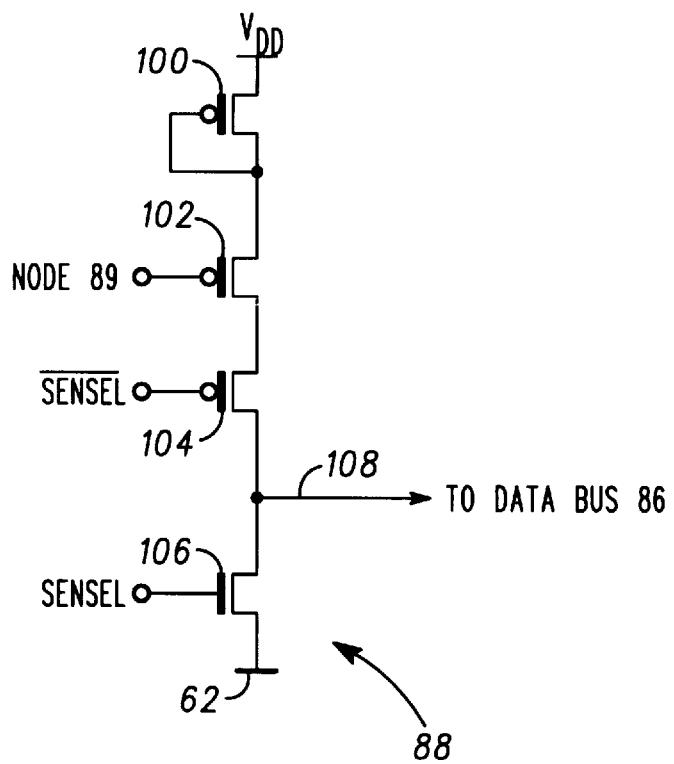
FIG. 4 is a schematic diagram of a threshold sense amp.

Turning to FIG. 4, VT sense amp 88 is shown including diode-configured transistor 100 serially coupled with transistors 102, 104 and 106 between VDD and power supply conductor 62. Transistors 100–106 operate as a comparator. The VT sense amp is enabled by SENSEL operating at logic one to turn on transistor 106 and $\overline{\text{SENSEL}}$ operating at logic zero to turn on transistor 104. If the gate voltage to transistor 102 is greater than VDD+(VT100+VT102), then transistors 100 and 102 are non-conductive and transistor 106 pulls output 108 to zero volts. VT100 is the negative threshold voltage of transistor 100, and VT102 is the negative threshold voltage of transistor 102. If the gate voltage to transistor 102 is less than VDD+(VT100+VT102), then transistors 100 and 102 conduct and pull output 108 to a high voltage (VDD). Transistor 106 has a high drain-source resistance to allow transistor 102 to overpower. VT sense amp 90 follows a similar construction and operation as VT sense amp 88.

The normal process of reading an EEPROM cell is to apply zero volts to the gate and source of transistor 36, i.e. gate-source voltage (VGS) is zero. Erase line 68 is set to zero volts. The selected ROWn signal turns on transistor 66 and applies zero volts to the gate of transistor 36. RAGNDL is set to logic one to turn on transistor 60 and pull array ground node 56 to zero volts. If EEPROM cell 32 is in its erase state, no current flows between the drain and source of transistor 36 because VGS=0 is not greater than VT=5. Data sense amp 78 detects zero current flow in bit line 50 and provides a logic zero voltage on bit 7 of data bus 86. If EEPROM cell 32 is in its write state, a 50 microamp current flows between the drain and source of transistor 36 because VGS=0 is greater than VT=−5. Data sense amp 78 detects a current flow in bit line 50 and provides a logic one voltage on bit 7 of data bus 86.

To read the negative VT of transistor 36, the reverse of the normal read process is performed. RAGNDL is set to logic zero to turn off transistor 60. RAGNDH is set to logic zero to turn on transistor 74 and pull array ground node 56 to a high voltage VPP=10 volts that is generated by charge pump 26 or applied externally. The first conduction terminal of transistor 36, that is coupled to array ground node 56, effectively becomes the drain and the second conduction terminal of transistor 36, coupled to select transistor 34, effectively becomes the source because the first conduction terminal is operating at a higher voltage than the second conduction terminal. Erase line 68 is set to zero volts. The selected ROWn signal turns on transistors 34 and 66 with a gate voltage of VPP=10 volts and applies the zero volts to the gate of transistor 36.

Assume that the manufacturing process has produced a VT of −5 volts on the floating gate of transistor 36. Assume the source voltage (second conduction terminal) starts at zero volts. In measurement mode with VPP=10 volts on the drain (first conduction terminal) and zero volts on the gate of transistor 36, the gate-source voltage (VGS) of transistor 36 is zero which is greater than its negative VT=−5 volts. Transistor 36 turns on and the source voltage increases. The source voltage of transistor 36 rises until it reaches its limit of 5 volts. At that point, VGS=−5 volts which is equal to its VT and transistor 36 stops conducting. Thus, in measurement mode, the source (second conduction terminal) of transistor 36 becomes substantially equal to the absolute value of its negative VT.

The source voltage of transistor 36 is routed through select transistor 34 with substantially no voltage drop because its gate is operating at VPP=10 volts and through selection network 76 to node 89. The SENSEL signal is set to logic one and the $\overline{\text{SENSEL}}$ signal is set to logic zero to block conduction through transmission gate 92 and isolate data sense amp 78 from data bus 86. The SENSEL signal operating at logic one and the $\overline{\text{SENSEL}}$ signal operating at logic one turns on transistors 104 and 106 in FIG. 4.

In measurement mode, the power supply potential VDD is externally controlled to increase from a low value, e.g. 2 volts, until the output of VT sense amp 88 changes state. Assume that VT100 and VT102 are each equal to −1 volts. When VDD=2 volts, the gate voltage to transistor 102, i.e. 5 volts in the present example, is greater than VDD+ (VT100+VT102). Transistors 100 and 102 are non-conductive and transistor 106 holds output 108 at zero volts. When VDD exceeds 7 volts, the gate voltage to transistor 102 becomes less than VDD+(VT100+VT102). Transistors 100 and 102 conduct and pull output 108 to a high voltage. The output of VT sense amp 88 thus changes state to indicate the value of the negative VT has been determined. The output of VT sense amp 88 is read from data bus 86. The value of the negative VT of transistor 36 is measured as the level of the externally controlled VDD that causes the output of VT sense amp 88 to change state, plus the sum of negative valued VT100 and VT102, i.e. measured negative VT of transistor 36=VDD+(VT100+VT102).

The negative VTs of the other memory cell in EEPROM array 24 can be measured in a similar manner. For example, the negative VT of transistor 42 is measured with VT sense amp 90.

By now it should be appreciated that the present invention provides an EEPROM embedded as an integrated circuit in a PDC. The EEPROM has a number of rows of memory cells each having outputs respectively coupled to bit lines. The EEPROM cells have a common array ground node. A pull-up transistor is coupled to the common array ground node for developing a first positive voltage on the common array ground node which in turn develops a second positive voltage on the output of one of the memory cells corresponding to a negative threshold voltage of the memory cell. A VT sense amp is coupled to each of the bit lines for detecting the level of the second positive voltage and thus determining the negative threshold voltage of the memory cell. The value of the negative VT of the floating gate transistor is measured as the level of the externally applied VDD that causes the output of the VT sense amp to change state, plus the sum of two negative threshold voltages.

What is claimed is:

1. A non-volatile memory circuit (24), comprising:
   a plurality of memory cells (32, 38) having outputs respectively coupled to a plurality of bit lines (50, 54) and having a common array ground node (56);
   a pull-up circuit (74) coupled to the common array ground node for developing a first positive voltage on the common array ground node which in turn develops a second positive voltage on the output of a first one of the plurality of memory cells corresponding to a negative threshold voltage of the first one of the plurality of memory cells; and
   a first sensing circuit (88) having an input coupled to a first one of the plurality of the bit lines for detecting a level of the second positive voltage.

2. The non-volatile memory circuit of claim 1 further including a second sensing circuit (78) having an input coupled to the first one of the plurality of bit lines and having an output for providing a data signal on a data bus (86).

3. The non-volatile memory circuit of claim 2 further including a transmission gate (92) responsive to a select signal and coupled between the output of the second sensing circuit and the data bus.

4. The non-volatile memory circuit of claim 1 wherein the pull-up circuit includes a first transistor (74) having a first conduction terminal coupled to a power supply conductor (VPSW), a second conduction terminal coupled to the common array ground node, and a control terminal coupled for receiving a control signal (RAGNDH).

5. The non-volatile memory circuit of claim 1 wherein the first sensing circuit includes:
   a first transistor (102) having a first conduction terminal coupled to a first power supply conductor (VDD), a second conduction terminal coupled to an output (108) of the first sensing circuit, and a control terminal coupled to the first one of the plurality of bit lines; and
   a second transistor (106) having a first conduction terminal coupled to the output of the first sensing circuit, a second conduction terminal coupled to a second power supply conductor (62), and a control terminal coupled for receiving a sense select signal (SENSEL).

6. The non-volatile memory circuit of claim 5 wherein the first sensing circuit further includes:
   a third transistor (100) having a first conduction terminal coupled to the first power supply conductor, a second conduction terminal and a control terminal coupled together to the first conduction terminal of the first transistor; and
   a fourth transistor (104) having a first conduction terminal coupled to the second conduction terminal of the first transistor, a second conduction terminal coupled to the output of the first sensing circuit, and a control terminal coupled for receiving an inverted sense select signal.

7. The non-volatile memory circuit of claim 1 wherein the first sensing circuit receives a power supply voltage level (VDD) that is varied to detect the level of the second positive voltage as where the output of the first sensing circuit changes state.

8. The non-volatile memory circuit of claim 1 wherein the plurality of memory cells are arranged on at least one semiconductor die (12) that is embedded in a portable data carrier (10).

9. A method of measuring a negative threshold voltage of a non-volatile memory cell, comprising the steps of:
   providing a first plurality of memory cells (32, 38) having outputs respectively coupled to the plurality of bit lines (50, 54) and having a common array ground node (56);
   developing a first positive voltage on the common array ground node which in turn develops a second positive voltage on the output of a first one of the plurality of memory cells corresponding to the negative threshold voltage of the first one of the plurality of memory cells; and
   detecting a level of the second positive voltage.

10. The method of claim 9 wherein the step of detecting a level of the second positive voltage includes the step of comparing the second positive voltage to a variable power supply level and changing state of the comparison when the variable power supply level reaches a level above the second positive voltage.

11. The method of claim 9 further comprising the step of arranging the plurality of memory cells on at least one semiconductor die that is embedded in a portable data carrier.

* * * * *